(12) United States Patent
Takinishi

(10) Patent No.: US 11,877,386 B2
(45) Date of Patent: Jan. 16, 2024

(54) INJECTION MOLDED ARTICLE AND METHOD FOR PRODUCING SAME

(71) Applicant: NISSHA CO., LTD., Kyoto (JP)

(72) Inventor: Yasuisa Takinishi, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 0 days.

(21) Appl. No.: 18/154,856

(22) Filed: Jan. 16, 2023

(65) Prior Publication Data
US 2023/0171878 A1 Jun. 1, 2023

Related U.S. Application Data

(63) Continuation of application No. PCT/JP2021/036239, filed on Sep. 30, 2021.

(30) Foreign Application Priority Data

Oct. 9, 2020 (JP) ................................. 2020-171152

(51) Int. Cl.
*H05K 1/02* (2006.01)
*H05K 3/14* (2006.01)
(Continued)

(52) U.S. Cl.
CPC ..... *H05K 1/0256* (2013.01); *B29C 45/14336* (2013.01); *H05K 3/0014* (2013.01);
(Continued)

(58) Field of Classification Search
CPC ........ H05K 1/02; H05K 1/0256; H05K 1/113; H05K 1/115; H05K 1/162; H05K 3/0014;
(Continued)

(56) References Cited

U.S. PATENT DOCUMENTS 5,610,431 A * 3/1997 Martin ................ G01P 15/0802
257/419
5,780,143 A * 7/1998 Shimamoto .......... H05K 3/4069
428/209
(Continued)

FOREIGN PATENT DOCUMENTS

JP H07142817 6/1995
JP H09321427 12/1997
(Continued)

OTHER PUBLICATIONS

"International Search Report (Form PCT/ISA/210) of PCT/JP2021/036239", dated Oct. 26, 2021, with English translation thereof, pp. 1-4.
(Continued)

*Primary Examiner* — Xiaoliang Chen
(74) *Attorney, Agent, or Firm* — JCIPRNET

(57) ABSTRACT

An injection molded article is provided with: a flat molded resin body that has a flat rectangular parallelepiped shape and is formed from an injection molded resin; and a base sheet affixed to the surface of the molded resin body. The base sheet has formed therein a first conductive layer on a first surface and a through hole passing through from the first surface to a second surface. The through hole is filled with a conductive material, and a second conductive layer is formed so as to be electrically connected with the first conductive layer via the conductive material with which the through hole is filled. In addition, a sealing material is formed on the first conductive layer so as to cover the through hole. The molded resin body is fixed together with the first surface side of the base sheet so as to cover the sealing material.

13 Claims, 5 Drawing Sheets

(51) Int. Cl.

| | |
|---|---|
| *H05K 3/38* | (2006.01) |
| *H01L 21/50* | (2006.01) |
| *H01L 21/78* | (2006.01) |
| *H01L 23/02* | (2006.01) |
| *H01L 23/04* | (2006.01) |
| *H01L 23/053* | (2006.01) |
| *H01L 23/58* | (2006.01) |
| *H01L 23/373* | (2006.01) |
| *H01L 23/544* | (2006.01) |
| *H01L 23/552* | (2006.01) |
| *B29C 45/14* | (2006.01) |
| *H05K 3/00* | (2006.01) |
| *B29L 31/34* | (2006.01) |

(52) U.S. Cl.
CPC ......... *H05K 3/0091* (2013.01); *H05K 3/0094* (2013.01); *B29L 2031/3425* (2013.01)

(58) Field of Classification Search
CPC .. H05K 3/0038; H05K 3/0091; H05K 3/0094; H05K 3/423; H05K 3/4096; H05K 3/4614; H05K 3/4652; H05K 3/4694; H01L 21/50; H01L 21/78; H01L 21/4857; H01L 21/6835; H01L 23/02; H01L 23/04; H01L 23/053; H01L 23/58; H01L 23/373; H01L 23/481; H01L 23/544; H01L 23/552; H01L 23/562; H01L 23/3114; H01L 23/3121; H01L 23/3128; H01L 23/5383; H01L 23/5386; H01L 23/5389; H01L 24/03; H01L 24/05; H01L 24/20; H01L 24/25; H01L 24/81; B29C 45/14336; B29L 2031/3425
USPC ................ 174/255, 251; 361/774, 778, 767; 438/70, 106, 109, 430, 612, 613, 640, 438/667, 675
See application file for complete search history.

(56) References Cited

U.S. PATENT DOCUMENTS

| | | | | | |
|---|---|---|---|---|---|
| 6,037,665 | A * | 3/2000 | Miyazaki | .......... | H01L 23/49827 257/E21.511 |
| 8,946,906 | B2 * | 2/2015 | Maeda | .............. | H01L 23/49822 257/E23.145 |
| 10,798,822 | B2 * | 10/2020 | Yang | ................. | H01L 23/49833 |
| 2003/0045024 | A1 * | 3/2003 | Shimoto | ................... | H05K 3/20 438/106 |
| 2006/0079162 | A1 | 4/2006 | Yamashita et al. | | |
| 2009/0007425 | A1 * | 1/2009 | Shinada | ............... | H05K 3/4614 29/843 |
| 2009/0115042 | A1 * | 5/2009 | Koyanagi | ........... | H01L 23/3135 438/109 |
| 2009/0243100 | A1 * | 10/2009 | Akiyama | .......... | H01L 23/49816 257/738 |
| 2010/0013068 | A1 * | 1/2010 | Huang | ................... | H05K 1/162 257/676 |
| 2010/0031502 | A1 * | 2/2010 | Cheng | .................. | H05K 3/0038 29/846 |
| 2010/0096713 | A1 * | 4/2010 | Jung | ..................... | B81C 1/0023 257/690 |
| 2010/0109142 | A1 * | 5/2010 | Toh | ...................... | H01L 23/3135 257/E23.06 |
| 2010/0140800 | A1 * | 6/2010 | Hagihara | ................ | H01L 24/81 257/737 |
| 2012/0214302 | A1 * | 8/2012 | Jeong | ................ | H01L 23/49827 257/E21.589 |
| 2013/0200526 | A1 * | 8/2013 | Moon | ............... | H01L 21/76898 257/774 |
| 2013/0207241 | A1 * | 8/2013 | Lee | ........................ | H01L 23/481 257/621 |
| 2013/0207242 | A1 * | 8/2013 | Lee | ........................ | H01L 23/481 257/621 |
| 2013/0210222 | A1 * | 8/2013 | Lee | ......................... | H01L 24/03 438/612 |
| 2013/0258625 | A1 * | 10/2013 | Terui | .................... | H01L 23/5382 174/251 |
| 2013/0323875 | A1 * | 12/2013 | Park | ................ | H01L 31/022408 438/70 |
| 2013/0344655 | A1 * | 12/2013 | Ohba | ................ | H01L 21/76898 438/109 |
| 2014/0035164 | A1 * | 2/2014 | Moon | ................ | H01L 21/76898 257/774 |
| 2014/0312491 | A1 * | 10/2014 | Jin | ....................... | H01L 23/5225 257/737 |
| 2014/0357077 | A1 * | 12/2014 | Lee | ................... | H01L 21/76898 438/667 |
| 2015/0382463 | A1 * | 12/2015 | Kim | ..................... | H05K 3/4007 29/829 |
| 2016/0086874 | A1 * | 3/2016 | Choi | ................ | H01L 21/76898 257/774 |
| 2016/0086879 | A1 * | 3/2016 | Sun | ................... | H01L 23/49822 174/251 |
| 2016/0163957 | A1 * | 6/2016 | Ajima | ...................... | H03H 3/08 29/25.35 |
| 2016/0351543 | A1 * | 12/2016 | Ryu | ...................... | H01L 25/105 |
| 2018/0053797 | A1 * | 2/2018 | Lee | ................... | H01L 21/76898 |
| 2018/0063961 | A1 * | 3/2018 | Kim | ........................ | H01L 24/19 |
| 2018/0138132 | A1 * | 5/2018 | Nishizawa | ............ | H01L 23/544 |
| 2018/0315620 | A1 * | 11/2018 | Lee | ................... | H01L 21/02118 |
| 2018/0352658 | A1 * | 12/2018 | Yang | ....................... | H01L 24/25 |
| 2020/0258976 | A1 * | 8/2020 | Park | ...................... | H01L 28/60 |
| 2021/0257324 | A1 * | 8/2021 | Park | ...................... | H01L 24/08 |
| 2021/0375766 | A1 * | 12/2021 | Tung | ................... | H01L 23/3736 |
| 2022/0338346 | A1 * | 10/2022 | Nam | ....................... | H01L 23/12 |

FOREIGN PATENT DOCUMENTS

| | | |
|---|---|---|
| JP | 2005039177 | 2/2005 |
| JP | 2006116692 | 5/2006 |
| JP | 2013094986 | 5/2013 |

OTHER PUBLICATIONS

"Notice of Reasons for Refusal of Japan Counterpart Application", dated May 11, 2022, with English translation thereof, p. 1-p. 7.

* cited by examiner

INJECTION MOLDED ARTICLE AND METHOD FOR PRODUCING SAME

CROSS-REFERENCE TO RELATED APPLICATIONS

This application is a continuation application of International Application number PCT/JP2021/036239, filed on Sep. 30, 2021, which claims the priority benefit of Japan Patent Application No. 2020-171152, filed on Oct. 9, 2020. The entirety of each of the above-mentioned patent applications is hereby incorporated by reference herein and made a part of this specification.

TECHNICAL FIELD

The present invention relates to an injection molded article including a base sheet having a conductive layer and a through hole and a method for producing the same.

BACKGROUND ART

There is an injection molded article in which a base sheet having a conductive layer formed on both surfaces is fixed to the surface. Each conductive layer is electrically connected via a conductive material filled into a through hole that penetrates the base sheet. For example Patent Literature 1 discloses a printed wiring board molded product in which a base sheet having circuit patterns formed on both surfaces is integrated with a molded resin. Each circuit pattern is electrically connected with a copper plating layer formed in a through hole that penetrates the base sheet. In the printed wiring board molded product, in order to prevent conduction of the through hole part from being damaged due to heat and a resin pressure during resin injection, a cover film is formed on the surface of the base sheet adhered to the injected resin.

CITATION LIST

Patent Literature

Patent Literature 1: Japanese Patent Laid-Open No. H7-142817

SUMMARY OF INVENTION

Technical Problem

Since the above conventional printed wiring board molded product uses a cover film, it cannot be partially formed only on the through hole involved in conduction between both surfaces of the substrate, and it is thus only possible to form a cover film over the entire surface of the base sheet. In addition, when forming is performed, there is another layer on a cover film and between the cover film and the base sheet, bubbles and wrinkles may occur in that layer, and it may not be applied to a 3D-shaped molded product.

The present invention has been made in order to address the above problem, and an objective of the present invention is to inhibit a flow of a conductive material filled into a through hole due to heat and a resin pressure during resin injection and prevent disconnection between conductive layers without using a cover film that covers the entire surface of a base sheet.

Solution to Problem

In order to achieve the above objective, a first invention provides an injection molded article including a base sheet in which a first conductive layer is formed on a first surface and a second conductive layer electrically connected to the first conductive layer is formed on a second surface via a conductive material filled into a through hole that penetrates from the first surface to the second surface, a sealing material that is formed on at least the first conductive layer so that it covers the through hole, and a molded resin body that is formed on the base sheet so that it covers the sealing material and composed of an injection molded resin.

A second invention provides the injection molded article in the first invention in which the sealing material protrudes toward the through hole.

With such a configuration, since the injection molded resin makes it difficult for the conductive material in the through hole to flow, it is possible to prevent disconnection between the first conductive layer and the second conductive layer.

A third invention provides the injection molded article in the first invention or the second invention in which the sealing material is formed to straddle over the first surface of the base sheet from above the first conductive layer.

With such a configuration, since the sealing material is fixed to the base sheet in addition to the first conductive layer, the injection molded resin can make it difficult for the sealing material to flow.

A fourth invention provides the injection molded article in any invention of the first to third inventions in which the sealing material is composed of the same material as the conductive material.

With such a configuration, since the sealing material entering the through hole becomes a conductive material, it is possible to more reliably prevent the resistance value of a conduction part between the first conductive layer and the second conductive layer from increasing.

A fifth invention provides the injection molded article in any invention of the first to fourth inventions further including a flexible printed wiring board fixed for electrical connection with a conductive adhesive, wherein the second conductive layer is the conductive adhesive.

With such a configuration, since it is not necessary to provide a terminal for connection to the flexible printed wiring board, the amount of the material of the injection molded article can be reduced and the configuration can be simplified.

A sixth invention provides the injection molded article in any invention of the first to fourth inventions further including a first detection electrode that is electrically connected to the first conductive layer, detects a touch input position, and is formed on the first surface, wherein the first conductive layer is a first routing wiring through which a signal detected by the first detection electrode is transmitted, and wherein the second conductive layer is a second routing wiring through which the signal transmitted from the first routing wiring is additionally transmitted via the conductive material.

With such a configuration, even in a touch panel in which a routing wiring is extracted from the first surface to the second surface through the through hole, since the injection molded resin makes it difficult for the conductive material in the through hole to flow, it is possible to prevent disconnection between the first routing wiring and the second routing wiring.

A seventh invention provides a method for producing an injection molded article, including a process in which a base sheet in which a first conductive layer is formed on a first surface, a second conductive layer electrically connected to the first conductive layer is formed on a second surface via a conductive material filled into a through hole that penetrates from the first surface to the second surface, and a sealing material is formed on at least the first conductive layer so that it covers the through hole is arranged in a cavity of an injection molding mold so that the second surface is in contact with a cavity surface; a process in which a molten resin is injected and filled into the cavity so that the conductive material does not flow; and a process in which the molten resin is cooled and solidified, and the base sheet is fixed to the surface of a molded resin body at the same time when the molded resin body is formed.

With such a configuration, since the sealing material inhibits the molten resin entering the through hole, it is possible to produce an injection molded article in which the first conductive layer and the second conductive layer are electrically connected.

Advantageous Effects of Invention

According to the present invention, it is possible to obtain an injection molded article in which disconnection between a first conductive layer and a second conductive layer is prevented.

DESCRIPTION OF EMBODIMENTS

Next, embodiments of the invention will be described with reference to the drawings.

Figure 1:
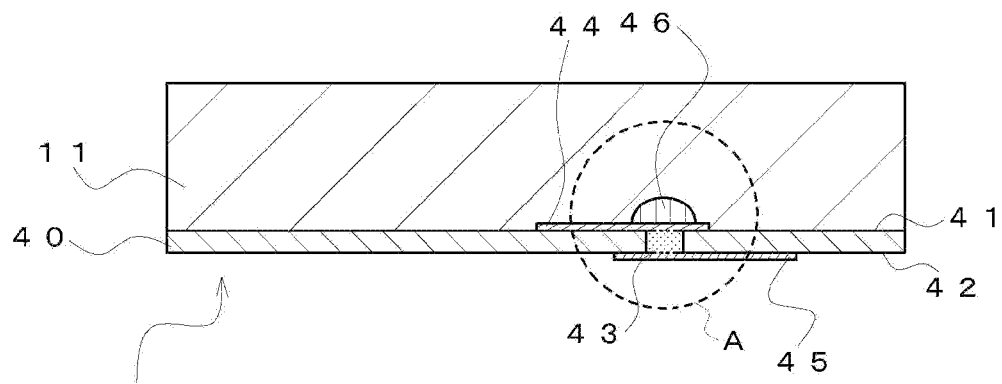
FIG. 1 is a schematic cross-sectional view of an injection molded article according to a first embodiment of the present invention.

With reference to FIG. 1, an injection molded article 10 according to a first embodiment of the present invention has a flat rectangular parallelepiped shape, and includes a flat molded resin body 11 composed of an injection molded resin and a base sheet 40 fixed to the surface of the molded resin body 11. In the base sheet 40, a strip-shaped first conductive layer 44 that laterally extends on a first surface 41 and a through hole 43 that penetrates from the first surface 41 to a second surface 42 are formed. The through hole 43 is filled with a conductive material, and a strip-shaped second conductive layer 45 that laterally extends is formed on the second surface 42 so that it is electrically connected to the first conductive layer 44 via the filled conductive material. In addition, a sealing material 46 is formed on the first conductive layer 44 so that it covers the through hole 43. Here, covering the through hole 43 includes not only completely covering the through hole 43 with the sealing material 46 but also partially covering the through hole 43 with the sealing material 46 with a part of the through hole 43 exposed. The molded resin body 11 is fixed to the side of the first surface 41 of the base sheet 40 so that it covers the sealing material 46.

In other words, the base sheet 40 includes the through hole 43 that penetrates from the first surface 41 to the second surface 42 and filled with a conductive material, the first conductive layer 44 formed on the first surface 41 at a position overlapping at least the opening of the through hole 43 in a plan view, the sealing material 46 formed on the first conductive layer 44 at a position overlapping at least the opening of the through hole 43 in a plan view, and the second conductive layer 45 formed at a position overlapping at least the opening of the through hole 43 in a plan view so that it is electrically connected to the first conductive layer 44 with the conductive material filled into the through hole 43, and the injection molded article 10 has the molded resin body 11 on the first surface of the base sheet 40.

The "conductive material filled into a through hole" used in the present invention is not limited to the conductive material completely filled into the through hole 43 but may indicate that a conductive material may be formed only on the wall surface of the through hole 43 and the inside of the through hole 43 may be hollow as long as a first conductive material 44 and a second conductive material 45 can be electrically connected. Even if the inside of the through hole 43 is hollow, since the sealing material 46 can protect the conductive material in the through hole 43 from an injection pressure when the molded resin body 11 is formed, it is possible to prevent disconnection between the first conductive layer 44 and the second conductive layer 45. However, it is preferable that the inside of the through hole 43 be completely filled with a conductive material because then the conductive material is less likely to be extruded due to the injection pressure.

Figure 2:
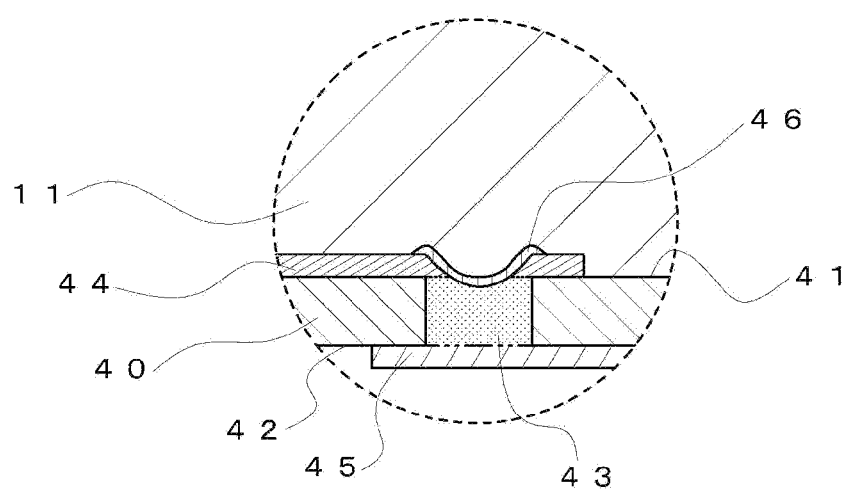
FIG. 2 is an enlarged view of a part A of the injection molded article shown in FIG. 1.
Figure 3:
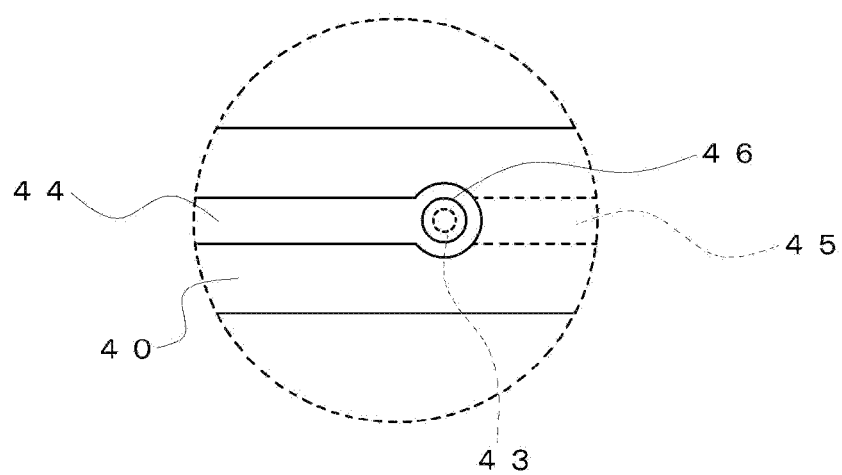
FIG. 3 is a plan view of the part A of the injection molded article shown in FIG. 1.

A detailed shape of the sealing material 46 will be described with reference to FIG. 2. FIG. 2 is an enlarged view of a part A indicated by a dashed line in FIG. 1. The sealing material 46 protrudes from above the first conductive layer 44 toward the through hole 43 due to the injection pressure when the molded resin body 11 is formed and a part of the sealing material 46 enters the through hole 43. In the first conductive layer 44, a hole through which the sealing material 46 penetrates is open, but the first conductive layer 44 and the conductive material in the through hole 43 are in contact with each other so that the first conductive layer 44 and the second conductive layer 45 are not disconnected. FIG. 3 is a plan view of an enlarged part A when viewed from the side of the first surface 41 of the base sheet 40. Here, the molded resin body 11 is omitted, and the through hole 43 hidden by the sealing material 46 and the second conductive layer 45 formed on the side of the second surface 42 are indicated by dashed lines. The first conductive layer 44 and the second conductive layer 45 have a circular shape above the through hole 43 so that they cover the opening of the through hole 43, the first conductive layer 44 extends from the through hole 43 to the left side, and the second conductive layer 45 extends from the through hole 43 in a direction opposite to the right side in a strip shape. The area of the opening of the through hole 43 and the areas of bottoms of the first conductive layer 44 and the sealing material 46 above the opening of the through hole are in the order of the through hole 43< the sealing material 46< the first conductive layer 44, and when the sealing material 46 having a size at which the opening of the through hole 43 can be covered is simply formed, it can protect against the injection pressure when the molded product 11 is formed. In addition, the area of the bottom of the sealing material 46 is preferably 1.2 to 2 times the area of the opening of the through hole 43. A size greater than 1.2 times can provide sufficient protection against the injection pressure and a size less than 2 times can provide effective protection against the injection pressure with less material waste.

The first conductive layer 44 is, for example, an electrode or wiring of a touch panel, a heater, a thermistor, an LED, and an antenna for transmission and reception of wireless communication, and the second conductive layer 45 is formed to extract an electrical signal of the first conductive layer 44 from the first surface 41 to the second surface 42 through the through hole 43. When the base sheet 40 having the first conductive layer 44 and the second conductive layer 45 is integrated with the molded resin body 11, it can be used as a housing having functions of a touch panel, a heater, a thermistor, an LED, and an antenna for transmission and reception of wireless communication corresponding to the function of the first conductive layer 44. The second conductive layer 45 is extracted to the outside of the injection molded article 10 by a terminal (not shown) and is connected to a control board that controls functions such as a touch panel, a heater, a thermistor, an LED, and an antenna for transmission and reception of wireless communication. The terminal is, for example, a flexible printed wiring board (FPC) or a contact pin. The contact pin is, for example, a cylindrical member made of a conductive material. When a control board having a contact pin is arranged below the second conductive layer 45, and the contact pin is fixed to the second conductive layer 45 via a conductive adhesive, the second conductive layer 45 and the control board can be connected.

The base sheet 40 is, for example, a thermoplastic resin such as a polypropylene resin, a polyethylene resin, a polyamide resin, an acrylic resin, an olefin resin, an epoxy resin, a polyimide resin, a thermoplastic polyurethane, a silicone resin, a polyester resin, a vinyl chloride resin, a polycarbonate resin, and an ABS resin or a laminate thereof. In addition, the thickness of the base sheet 40 is preferably, for example, 12 µm to 200 µm. If the base sheet 40 has a thickness of 12 µm or more, the thickness is excellent for handling properties, and if the thickness is 200 µm or less, the base sheet 40 has favorable flexibility due to appropriate rigidity.

The materials constituting the first conductive layer 44 and the second conductive layer 45 and the conductive material filled into the through hole 43 include, for example, metals such as gold, platinum, silver, copper, aluminum, nickel, zinc, and lead, metal oxides such as ITO, ZnO, IGO, IGZO, and CuO, conductive polymers such as polyethylene dioxythiophene (PEDOT) and polystyrene sulfonic acid (PSS), and carbon materials such as carbon nanotubes, graphite, and graphene. The materials described above may be used as pastes or nanofibers. Among these materials, particularly, a silver paste is preferably used. Since the silver paste has a property of being easily extended, disconnection is unlikely even if the base sheet 40 is deformed when handled. In addition, the same material or different materials may be used for the first conductive layer 44, the second conductive layer 45 and the conductive material filled into the through hole 43.

The thickness of the first conductive layer 44 and the second conductive layer 45 is preferably, for example, 1 µm to 15 µm. If the thickness of the first conductive layer 44 and the second conductive layer 45 is 1 µm or more, disconnection is unlikely, and if the thickness is 15 µm or less, flexibility becomes favorable and disconnection is unlikely even if the base sheet 40 is deformed when handled.

The material constituting the sealing material 46 that is selected from among the materials exemplified for the first conductive layer 44, the second conductive layer 45 and the conductive material filled into the through hole 43 can be used. Among these materials, it is preferable to use the same material as the conductive material filled into the through hole 43. If the same material as the conductive material filled into the through hole 43 is used, since the sealing material 46 entering the sealing material 46 becomes a conductive material, it is possible to more reliably prevent the resistance value of a conduction part between the first conductive layer 44 and the second conductive layer from increasing. In addition, a spreadable conductive polymer (those exemplified for the first conductive layer, carbon ink, etc.) can be used. In addition, the sealing material 46 may be formed using a resin material. Examples of resin materials include a UV curing resin and a 2-liquid curing resin. An acrylate-based or epoxy-based resin can be used as the UV curing resin. In addition, the 2-liquid curing resin includes polyurethane-based, silicon-based, epoxy-based, and acrylic-based resins.

The thickness of the sealing material 46 is preferably 2 µm to 500 µm. If the thickness is 2 µm or more, the conductive material filled into the through hole 43 can be more effectively protected against the injection pressure when the molded resin body 11 is formed, and if the thickness is 500 µm or less, the sealing material 46 has a size at which the conductive material filled into the through hole 43 can be prevented from flowing while reducing waste of the material forming the sealing material 46. The sealing material 46 can be formed over the first conductive layer 44 using, for example, a dispenser.

The molded resin body 11 is made of, for example, a general-purpose resin such as a polystyrene resin, a polyolefin resin, an ABS resin, an AS resin, and an AN resin, a general-purpose engineering resin such as a polycarbonate resin, an acrylic resin, and thermoplastic polyurethane, and a super engineering resin such as a polyimide resin and a liquid crystal polyester resin. In addition, a composite resin to which a reinforcing material such as glass fibers and inorganic fillers is added can be used. The thickness of the molded resin body 11 is not particularly limited, and is selected according to the thickness of the housing of the product to be produced.

Figure 4:
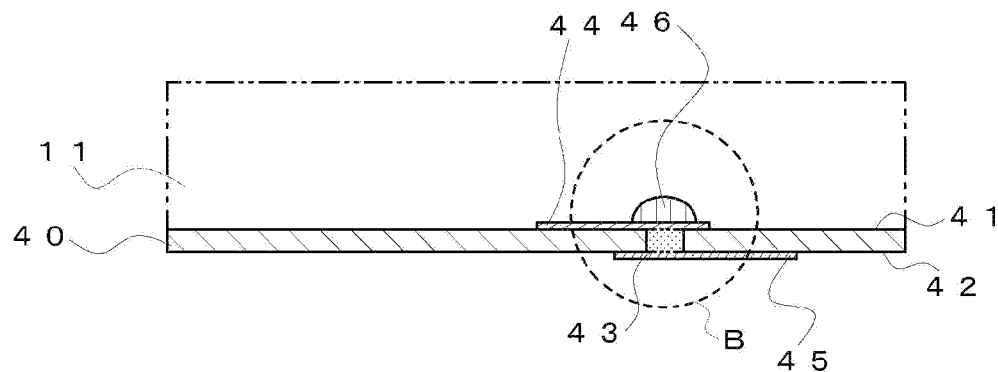
FIG. 4 is a schematic cross-sectional view of a base sheet used for the injection molded article according to the first embodiment of the present invention.
Figure 5:
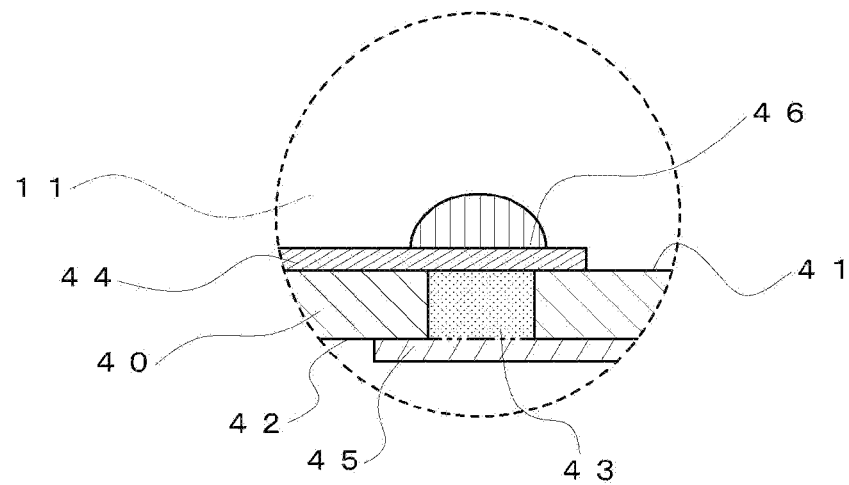
FIG. 5 is an enlarged view of a part B of a base sheet shown in FIG. 5.
Figure 6:
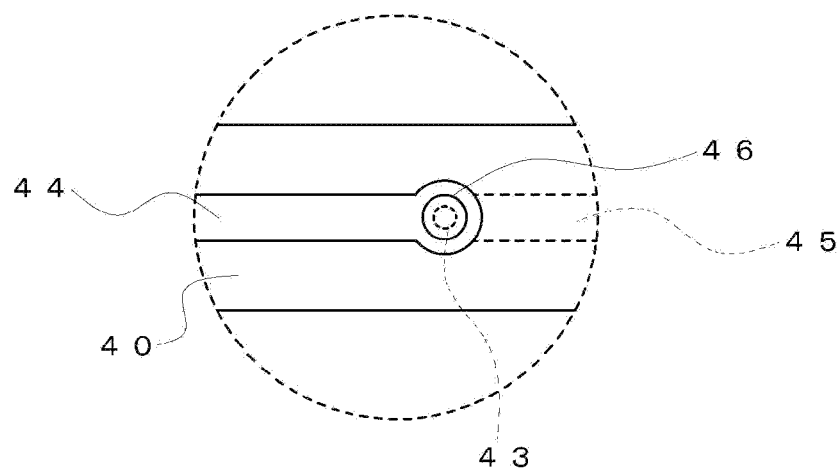
FIG. 6 is a plan view of the part B of the base sheet shown in FIG. 5.

Next, with reference to FIG. 4, the base sheet 40 before the molded resin body 11 is fixed is the same as the base sheet 40 that is fixed to the molded resin body 11 of the injection molded article 10 shown in FIG. 1, except for the shape of the sealing material 46. In addition, the molded resin body 11 to be formed by injection and molding is indicated by a two-dot dashed line. A detailed shape of the sealing material 46 will be described with reference to FIG. 5. FIG. 5 is an enlarged view of a part B indicated by a dashed line in FIG. 4. Unlike the shape of the sealing material 46 after injection and molding shown in FIG. 2, the sealing material 46 is formed on the first conductive layer 44 in a hemispherical shape that is convex on the side opposite to the through hole 43. In a procedure of forming and fixing the molded resin body 11 on the side of the first surface 41 of the base sheet 40 by injection and molding, as shown in FIG. 2, the injection pressure deforms the sealing material 46 into a shape protruding toward the through hole 43. FIG. 6 is a plan view of an enlarged part B when viewed from the side of the first surface 41 of the base sheet 40, and the positional relationship of the first conductive layer 44, the second conductive layer 45, and the sealing material 46 is the same as the positional relationship shown in FIG. 3 after being fixed to the molded resin body 11.

Next, a method for producing the injection molded article 10 will be described.

The base sheet 40 in which, on the first surface 41, via the first conductive layer 44, the through hole 43 that penetrates from the first surface 41 to the second surface 42, and the conductive material filled into the through hole 43, the second conductive layer 45 electrically connected to the first conductive layer 44 is formed on the second surface 42, and the sealing material 46 is formed on the first conductive layer 44 so that it covers the through hole 43 is prepared.

Figure 7:
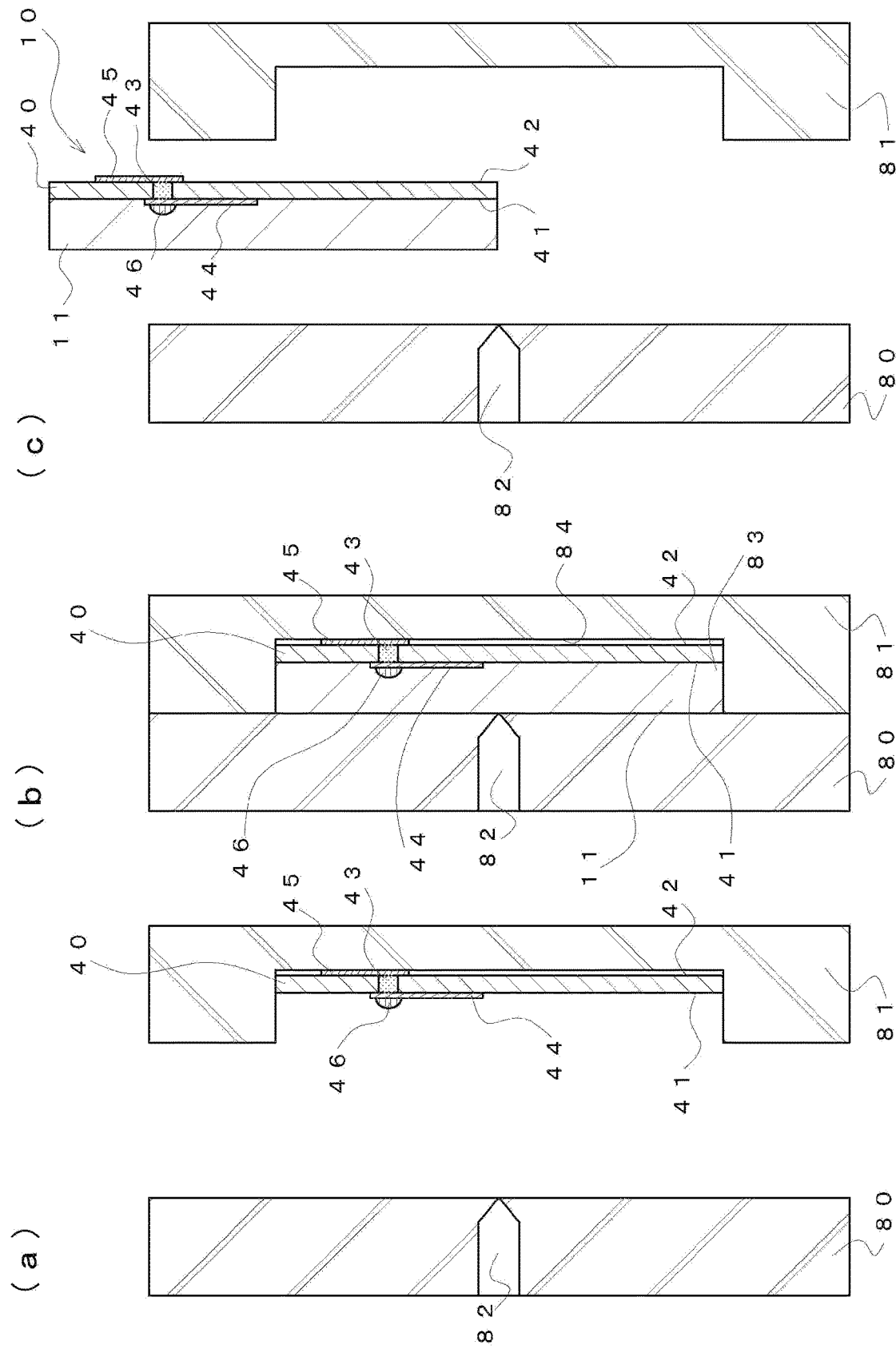
FIG. 7 shows schematic cross-sectional views illustrating a process of producing the injection molded article shown in FIG. 1.

Next, with reference to FIG. 7(a), an injection molding mold including a first mold 80 in which a resin injection port 82 is formed and a second mold 81 in which a concave part is formed is prepared, and the second surface 42 of the base sheet 40 is arranged in contact with the second mold 81. Next, with reference to FIG. 7(b), the first mold 80 and the second mold 81 are closed. A space formed by closing the first mold 80 and the second mold 81 is called a cavity 83, and the surface of the second mold 81 forming the cavity 83 is called a cavity surface 84. The base sheet 40 is arranged on the cavity surface 84 in contact with the second surface. Next, a molten resin is injected into the cavity 83 from the injection port 82 of the first mold 80. In this case, the sealing material 46 formed on the first conductive layer 44 of the base sheet 40 inhibits a flow of the conductive material in the through hole 43 due to the injection pressure of the molten resin, and the sealing material 46 protrudes toward the through hole 43. Next, the molded resin body 11 is formed by cooling the molten resin until it solidifies.

In the procedure of solidifying the molten resin and forming the molded resin body 11, the base sheet 40 is fixed to the surface of the molded resin body 11. Next, with reference to FIG. 7(c), the injection molding mold is open, the injection molded article 10 is extracted using an extraction arm (not shown), and thereby the injection molded article 10 is obtained.

Accordingly, in the injection molded article 10 produced as described above, since the sealing material 46 inhibits the molten resin entering the through hole 43, the molten resin makes it difficult for the conductive material filled into the through hole 43 to flow, and the injection molded article in which the first conductive layer 44 and the second conductive layer 45 are electrically connected can be produced.

Next, modified examples of the present invention will be described with reference to the drawings, focusing on points different from the previous embodiments.

Figure 8:
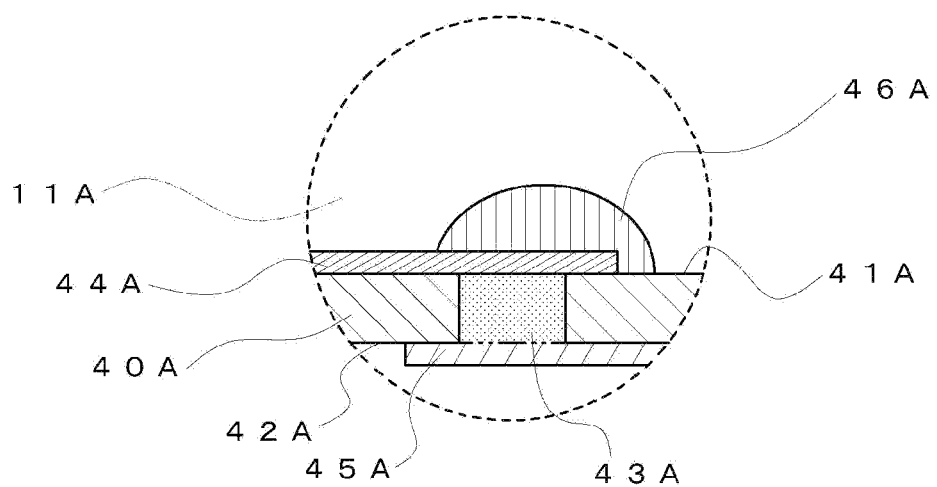
FIG. 8 is an enlarged view of a part C corresponding to FIG. 5, which shows a modified example of the base sheet of the present invention.
Figure 9:
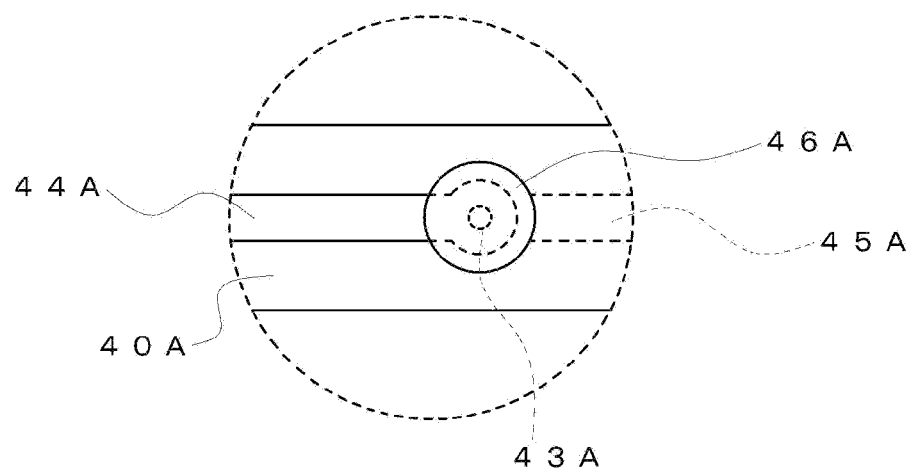
FIG. 9 is a plan view of a part C corresponding to FIG. 6, which shows a modified example of the base sheet of the present invention.

An injection molded article 10A which is a modified example of the present invention can be obtained using the same material and same production method as those of the injection molded article 10 shown in the previous embodiment. On the other hand, the formation position of a sealing material 46A of a base sheet 40A used for the injection molded article 10A is different. FIG. 8 is an enlarged view of a part C showing the periphery of the through hole of the base sheet 40A used for the injection molded article 10A and is a view corresponding to FIG. 5. FIG. 9 is a plan view of the part C, and is a view corresponding to FIG. 6. Modified examples will be described with reference to these drawings.

With reference to FIG. 8, a through hole 43A, a first conductive layer 44A, and a second conductive layer 45A formed in a base sheet 10A are formed in the same manner as in a base sheet 10 according to the first embodiment. The sealing material 46A is formed on at least the first conductive layer 44A so that it covers the through hole 43A like the base sheet 10 according to the first embodiment, but is additionally formed over a first surface 41A of the base sheet 10A from above the first conductive layer 44A. With reference to FIG. 9, the area of the opening of the through hole 43A and the areas of the bottoms of the first conductive layer 44A and the sealing material 46A above the opening of the through hole 43A are in the order of the through hole 43A< the first conductive layer 44A< the sealing material 46A, and the sealing material 46A can protect the through hole 43A. With such a configuration, when the base sheet 10A is placed in the injection molding mold and an injection molded resin is injected onto the first surface 41A to form a molded resin body 11A, since the sealing material 46A is also fixed to the first surface 41A of the base sheet 40A in addition to the first conductive layer 44A, the injection molded resin can make it difficult for the sealing material 46A to flow.

Next, a second embodiment of the present invention will be described with reference to the drawings, focusing on points different from the previous embodiment.

Figure 10:
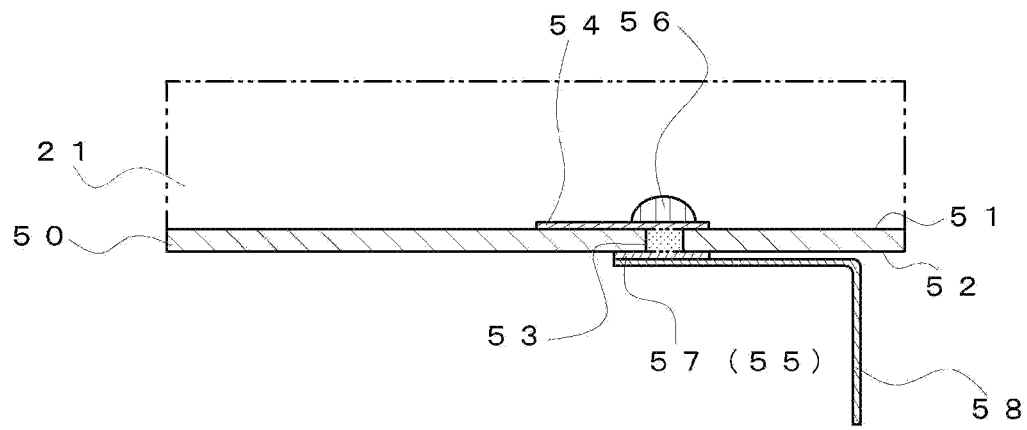
FIG. 10 is a schematic cross-sectional view of a base sheet used for an injection molded article according to a second embodiment of the present invention.

With reference to FIG. 10, an injection molded article 20 is the same as the injection molded article 10 shown in the first embodiment in that it has a flat rectangular parallelepiped shape, a first surface 51 of a base sheet 50 is fixed to a molded resin body 21 indicated by a two-dot dashed line, and the method for producing the injection molded article 20 is the same, but a second conductive layer 55 formed on a second surface 52 of the base sheet 50 is different. On the first surface 51 of the base sheet 50, a first conductive layer 54 is formed on a through hole 53 that penetrates from the first surface to the second surface, and a sealing material 56 is formed on the first conductive layer 54 so that it covers the through hole 53. The through hole 53 is filled with a conductive material. A conductive adhesive 57 is formed on the second surface 52 of the base sheet 50 so that it is electrically connected to a second conductive layer 54 via the conductive material of the through hole 53, and the conductive adhesive 57 is the second conductive layer 55. In addition, a flexible printed wiring board 58 is fixed so that it is electrically connected to the conductive adhesive 57. The flexible printed wiring board 58 is bent downward and connected to a control board (not shown).

When the base sheet 50 is placed in the injection molding mold and the molded resin body 21 is formed on the first surface 51, the injection molded article 20 can be obtained. With such a configuration, since it is not necessary to provide a terminal for connection to the flexible printed wiring board 58, the amount of the material of the injection molded article 20 can be reduced and the configuration can be simplified.

Next, a third embodiment of the present invention will be described with reference to the drawings, focusing on points different from the previous embodiment. An injection molded article 30 is the same as the injection molded article 10 shown in the first embodiment in that it has a flat rectangular parallelepiped shape, a first surface 61 of a base sheet 60 is fixed to a molded resin body 31 indicated by a two-dot dashed line, and the method for producing the injection molded article 30 is the same, but a first conductive layer 64 formed on the first surface 61 of the base sheet 60 and a second conductive layer 65 formed on a second surface 62 are different. In addition, the injection molded article 30 can be used as a touch panel.

Figure 11:
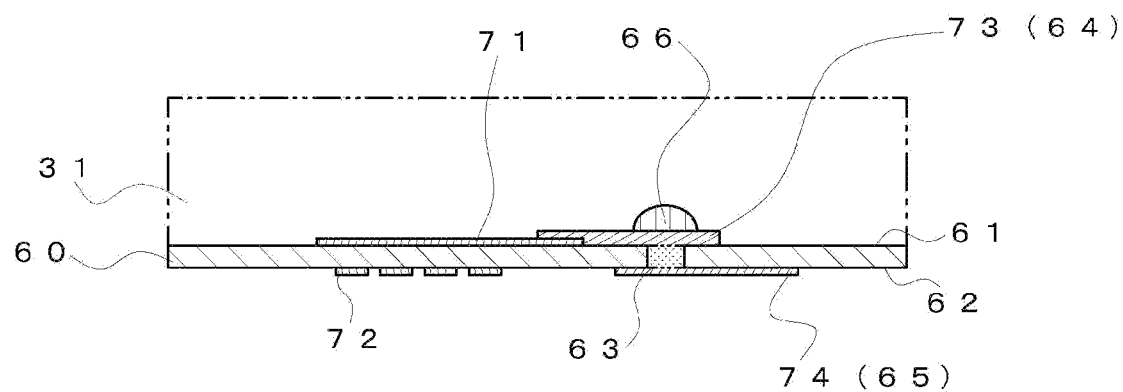
FIG. 11 is a schematic cross-sectional view of a base sheet used for an injection molded article according to a third embodiment of the present invention.

With reference to FIG. 11, a through hole 63 is formed in the base sheet 60, a conductive material is filled into the through hole 63, and at a position at which the through hole 63 is not formed on the first surface 61 of the base sheet 60, a strip-shaped first detection electrode 71 that laterally extends is formed. In FIG. 11, only one first detection electrode 71 is shown, but actually, a plurality of first detection electrodes 71 are formed parallel to each other so that they laterally extend in the front-rear direction with respect to the cross section of the base sheet 60. On the second surface 62, at positions at which the through hole 63 is not formed, a plurality of second detection electrodes 72 that extend forward and backward are formed parallel to each other, which are perpendicular to the plurality of first detection electrodes 71. In addition, a first routing wiring 73 is formed so that it covers the through hole 63 from above at least a part of the first detection electrode 71 over the first surface 61 of the base sheet 60 and thus it is electrically connected to the first detection electrode 71. The first routing wiring 73 is the first conductive layer 64. In addition, a second routing wiring 74 is formed on the second surface 62 so that it is electrically connected to the first routing wiring 73 via the conductive material in the through hole 63 so as to extract the first routing wiring 73 to the second surface 62. The second routing wiring 74 is the second conductive layer 65. A signal indicating the touch input position detected by the first detection electrode 71 is transmitted through the first routing wiring 73, and is extracted to the second surface 62 via the conductive material filled into the through hole 63 and transmitted to the second routing wiring 74. A signal indicating the touch input position detected by the second detection electrode 72 is transmitted through a routing wiring for the second detection electrode 72 (not shown). The second routing wiring 74 and the routing wiring for the second detection electrode 72 (not shown) are extracted to the outside of the injection molded article 30 by terminals (not shown) and connected to the control board. The terminal is, for example, a flexible printed wiring board (FPC) or a contact pin. A sealing material 66 is formed on the first routing wiring 73 so that it covers the through hole 63.

When the base sheet 60 is placed in the injection molding mold and the molded resin body 31 is formed on the first surface 61, the injection molded article 30 can be obtained. With such a configuration, even in a touch panel in which a routing wiring is extracted from the first surface to the second surface through the through hole 63, since the injection molded resin makes it difficult for the conductive material in the through hole 63 to flow, it is possible to prevent disconnection between the first routing wiring 73 and the second routing wiring 74.

The first routing wiring 73 and the second routing wiring 74 are made of, for example, metals such as gold, platinum, silver, copper, aluminum, nickel, zinc, and lead, metal oxides such as ITO, ZnO, IGO, IGZO, and CuO, conductive polymers such as polyethylene dioxythiophene (PEDOT) and polystyrene sulfonic acid (PSS), and carbon materials such as carbon nanotube, graphite, and graphene.

The thickness of the first routing wiring 73 and the second routing wiring 74 is preferably, for example, 1 µm to 15 µm. If the thickness of the first routing wiring 73 and the second routing wiring 74 is 1 µm or more, disconnection is unlikely, and if the thickness is 15 µm or less, flexibility becomes favorable and disconnection is unlikely even if the base sheet 60 is deformed when handled.

Here, in the above embodiments, the injection molded body is flat, the surface to which the base sheet is fixed is a flat surface, but the base sheet may be fixed to the curved surface. In the base sheet used in the present invention, a cover film for protection from the injection pressure of the molded resin is not used, and when the base sheet is formed into a 3D shape, it is not necessary to consider the occurrence of bubbles or wrinkles in the cover film or the layer between the base sheet and the cover film, and thus it is easy to apply an injection molded body having a curved fixing surface.

In addition, in the above embodiments, the first conductive layer, the sealing material, and the second conductive layer are formed on the base sheet, but a protective film may be additionally formed on the second surface of the base sheet. The process of arranging the second surface of the base sheet in contact with the cavity surface includes bringing the second surface of the base sheet into contact with the cavity surface via the protective film.

In addition, in the above embodiments, one through hole is formed in the base sheet, but the number of through holes is not limited to one, and a plurality of through holes may be formed.

In addition, in the above embodiments, the sealing material protrudes toward the through hole and enters the through hole, but it is sufficient that the sealing material inhibit a flow of the conductive material filled into a through hole due to the injection pressure of the molded resin, and a shape in which the upper part of the sealing material is recessed without entering the through hole or a hemispherical shape before the molded resin is injected without recessing the upper part of the sealing material may be used.

In addition, while the configuration in which the first conductive layer has an open hole through which the sealing material penetrates has been described in the above embodiments, a shape in which the first conductive layer is recessed toward the through hole due to the pressure of the sealing material pressed with the injection pressure of the molded resin may be used instead of making the hole open in the first conductive layer.

In addition, in the above embodiments, the first surface of the base sheet and the molded resin body are directly fixed, but the adhesive layer may be formed on the first surface of the base sheet, and the base sheet may be fixed to the molded resin body via the adhesive layer.

In addition, while the configuration in which the entire surface of the base sheet is fixed to the molded resin body has been described in the above embodiments, the base sheet may have a surface that does not adhere to the molded resin body or the base sheet may extend to the outside of the molded resin body. In addition, the second conductive layer may be extended to the outside of the molded resin body together with the base sheet, and may be connected to the control board at the part of the second conductive layer that is extended to the outside from the molded resin body.

What is claimed is:

1. An injection molded article, comprising:
   a base sheet in which a first conductive layer is formed on a first surface and a second conductive layer electrically connected to the first conductive layer is formed on a second surface via a conductive material completely filled into a through hole that penetrates from the first surface to the second surface;
   a sealing material that is formed on at least the first conductive layer so that it covers the through hole;

a molded resin body that is formed on the base sheet so that it covers the sealing material and composed of an injection molded resin; and a flexible printed wiring board fixed for electrical connection with a conductive adhesive, wherein the second conductive layer is the conductive adhesive, wherein the injection molded resin does not enter the through hole, and the injection molded resin is a thermoplastic resin.

2. The injection molded article according to claim 1, wherein the sealing material protrudes toward the through hole.

3. The injection molded article according to claim 1, wherein the sealing material is formed to straddle over the first surface of the base sheet from above the first conductive layer.

4. The injection molded article according to claim 1, wherein the sealing material is composed of the same material as the conductive material.

5. The injection molded article according to claim 1, further comprising
a first detection electrode that is electrically connected to the first conductive layer, detects a touch input position, and is formed on the first surface,
wherein the first conductive layer is a first routing wiring through which a signal detected by the first detection electrode is transmitted, and
wherein the second conductive layer is a second routing wiring through which the signal transmitted from the first routing wiring is additionally transmitted via the conductive material.

6. The injection molded article according to claim 2, wherein the sealing material is formed to straddle over the first surface of the base sheet from above the first conductive layer.

7. The injection molded article according to claim 2, wherein the sealing material is composed of the same material as the conductive material.

8. The injection molded article according to claim 3, wherein the sealing material is composed of the same material as the conductive material.

9. The injection molded article according to claim 2, further comprising
a first detection electrode that is electrically connected to the first conductive layer, detects a touch input position, and is formed on the first surface,
wherein the first conductive layer is a first routing wiring through which a signal detected by the first detection electrode is transmitted, and
wherein the second conductive layer is a second routing wiring through which the signal transmitted from the first routing wiring is additionally transmitted via the conductive material.

10. The injection molded article according to claim 3, further comprising
a first detection electrode that is electrically connected to the first conductive layer, detects a touch input position, and is formed on the first surface,
wherein the first conductive layer is a first routing wiring through which a signal detected by the first detection electrode is transmitted, and
wherein the second conductive layer is a second routing wiring through which the signal transmitted from the first routing wiring is additionally transmitted via the conductive material.

11. The injection molded article according to claim 4, further comprising
a first detection electrode that is electrically connected to the first conductive layer, detects a touch input position, and is formed on the first surface,
wherein the first conductive layer is a first routing wiring through which a signal detected by the first detection electrode is transmitted, and
wherein the second conductive layer is a second routing wiring through which the signal transmitted from the first routing wiring is additionally transmitted via the conductive material.

12. The injection molded article according to claim 6, further comprising
a first detection electrode that is electrically connected to the first conductive layer, detects a touch input position, and is formed on the first surface,
wherein the first conductive layer is a first routing wiring through which a signal detected by the first detection electrode is transmitted, and
wherein the second conductive layer is a second routing wiring through which the signal transmitted from the first routing wiring is additionally transmitted via the conductive material.

13. The injection molded article according to claim 7, further comprising
a first detection electrode that is electrically connected to the first conductive layer, detects a touch input position, and is formed on the first surface,
wherein the first conductive layer is a first routing wiring through which a signal detected by the first detection electrode is transmitted, and
wherein the second conductive layer is a second routing wiring through which the signal transmitted from the first routing wiring is additionally transmitted via the conductive material.

* * * * *